United States Patent
Sun et al.

(10) Patent No.: US 10,814,737 B2
(45) Date of Patent: Oct. 27, 2020

(54) OFF-BOARD CHARGER FOR HIGH-VOLTAGE BATTERY CHARGING

(71) Applicant: FORD GLOBAL TECHNOLOGIES, LLC, Dearborn, MI (US)

(72) Inventors: Xuemei Sun, Canton, MI (US); William David Treharne, Ypsilanti, MI (US); Jonathan Andrew Butcher, Farmington, MI (US); Robert John Link, Northville, MI (US); Philip Michael Gonzales, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 96 days.

(21) Appl. No.: 15/713,272

(22) Filed: Sep. 22, 2017

(65) Prior Publication Data

US 2018/0009322 A1 Jan. 11, 2018

Related U.S. Application Data

(62) Division of application No. 14/466,175, filed on Aug. 22, 2014, now Pat. No. 9,802,495.

(51) Int. Cl.
*B60L 53/62* (2019.01)
*B60L 53/14* (2019.01)
(Continued)

(52) U.S. Cl.
CPC ............ *B60L 53/62* (2019.02); *B60L 50/10* (2019.02); *B60L 53/14* (2019.02); *G01R 31/392* (2019.01); *B60L 2270/00* (2013.01); *Y02T 10/70* (2013.01); *Y02T 10/7072* (2013.01); *Y02T 90/12* (2013.01); *Y02T 90/14* (2013.01); *Y02T 90/16* (2013.01)

(58) Field of Classification Search
CPC .......... B60L 53/00; B60L 53/60; B60L 50/10; B60L 53/14; B60L 2270/00; G01R 31/392; Y02T 90/128; Y02T 90/14; Y02T 90/121; Y02T 10/70; Y02T 90/163; Y02T 10/7072; Y02T 10/7077; Y02T 10/7005
See application file for complete search history.

(56) References Cited

U.S. PATENT DOCUMENTS 2,558,434 A * 6/1951 Hofberg .................. E05F 15/77
178/116
5,220,268 A * 6/1993 Rose ...................... H02J 7/0045
320/107

(Continued)

FOREIGN PATENT DOCUMENTS

WO 2012115455 A2 8/2012

OTHER PUBLICATIONS

Medtronic Emergency Response Systems, Inc., Mobile Battery Service Station, TMS Medical Technologies, (2005) 2 pages.

*Primary Examiner* — Stacy Whitmore
(74) *Attorney, Agent, or Firm* — David Kelley; Brooks Kushman, P.C.

(57) ABSTRACT

An off-board battery charger for a vehicle may include a high-voltage connector having first, second and power supply connector ports. The first connector port connects to a vehicle controller via a first cable. The second connector port connects to a vehicle battery via a second cable. And, the power supply connector port is electrically connected with the second port and receives power via a power supply cable from a separate and external power supply.

6 Claims, 6 Drawing Sheets

(51) Int. Cl.
  *B60L 50/10* (2019.01)
  *G01R 31/392* (2019.01)

(56) References Cited

U.S. PATENT DOCUMENTS

| | | | |
|---|---|---|---|
| 7,253,584 B2 | 8/2007 | Souther et al. | |
| 7,692,401 B2* | 4/2010 | Gonzales | H02J 7/1423 |
| | | | 320/104 |
| 8,573,994 B2* | 11/2013 | Kiko | B60L 3/0069 |
| | | | 439/188 |
| 9,318,909 B2 | 4/2016 | Millet et al. | |
| 2001/0005126 A1 | 6/2001 | Ichihara et al. | |
| 2004/0130288 A1* | 7/2004 | Souther | B60L 58/10 |
| | | | 320/104 |
| 2006/0214637 A1* | 9/2006 | Gonzales | H02J 7/1423 |
| | | | 320/128 |
| 2008/0100259 A1* | 5/2008 | Tabatowski-Bush | |
| | | | B60K 6/445 |
| | | | 320/104 |
| 2009/0160402 A1 | 6/2009 | Wang et al. | |
| 2010/0123573 A1 | 5/2010 | Cawthorne et al. | |
| 2012/0319648 A1* | 12/2012 | Ohtomo | B60L 3/0069 |
| | | | 320/109 |
| 2013/0003237 A1* | 1/2013 | Casey | B60L 3/0046 |
| | | | 361/62 |
| 2013/0029193 A1* | 1/2013 | Dyer | B60L 53/14 |
| | | | 429/62 |
| 2013/0033237 A1* | 2/2013 | Kim | B60L 1/00 |
| | | | 322/25 |
| 2013/0116868 A1 | 5/2013 | Erko et al. | |
| 2013/0127413 A1* | 5/2013 | Ohtomo | B60L 3/003 |
| | | | 320/109 |
| 2013/0257344 A1 | 10/2013 | Millet et al. | |
| 2013/0307480 A1 | 11/2013 | Boggs et al. | |
| 2014/0021918 A1 | 1/2014 | Ichikawa et al. | |
| 2014/0062180 A1 | 3/2014 | Demmerle et al. | |
| 2014/0062397 A1* | 3/2014 | Dyer | H01M 10/486 |
| | | | 320/109 |
| 2014/0062398 A1 | 3/2014 | Satake et al. | |
| 2014/0159660 A1 | 6/2014 | Klose et al. | |
| 2015/0054460 A1* | 2/2015 | Epstein | B60L 11/187 |
| | | | 320/109 |
| 2015/0235539 A1 | 8/2015 | Orvis et al. | |
| 2015/0367744 A1 | 12/2015 | Saint-Marcoux et al. | |
| 2015/0379237 A1 | 12/2015 | Mills et al. | |
| 2016/0303956 A1* | 10/2016 | Nellen | B60J 7/057 |
| 2016/0303986 A1* | 10/2016 | Park | B60L 53/20 |
| 2018/0013180 A1* | 1/2018 | Dyer | B60L 53/302 |
| 2019/0190093 A1* | 6/2019 | Dyer | H01M 10/486 |

* cited by examiner

OFF-BOARD CHARGER FOR HIGH-VOLTAGE BATTERY CHARGING

CROSS-REFERENCE TO RELATED APPLICATIONS

This application is a division of U.S. application Ser. No. 14/466,175 filed Aug. 22, 2014, now U.S. Pat. No. 9,802,495 issued Oct. 31, 2017, the disclosure of which is hereby incorporated in its entirety by reference herein.

TECHNICAL FIELD

Disclosed herein is an off-board charger for high-voltage battery charging.

BACKGROUND

Hybrid vehicles and fuel cell vehicles may have two energy sources including a fuel source and a battery source. A high-voltage battery may be used to provide enough power to start an engine of a vehicle. The fuel source may in turn charge the battery when a charge level of the battery falls below a certain threshold. When a fault occurs in the vehicle, the battery charge may be consumed during an attempted start of the vehicle. This is often the case when a technician attempts to start the vehicle, but the engine is unable to start due to low fuel pump pressure, or other engine fault. When the charge of the battery is extremely low, the battery may need to be replaced. However, the high-voltage battery may not be faulty and replacing it may result in unnecessary costs to the manufacturer, the dealership, and the customer.

SUMMARY

An off-board charging system for charging a vehicle battery includes a connector including first and second terminals, and a pair of contacts at the first terminal. The connector is configured to receive power via an external power supply, and to connect with a vehicle controller via a first cable at the first terminal and to connect with a battery system via a second cable at the second terminal. The pair of contacts are configured to close in response to an actuation at the second terminal to permit current from the external power supply to pass to the vehicle controller via the first cable.

An off-board battery charger for a vehicle includes a high-voltage connector having a first connector port configured to connect to a vehicle controller via a first cable, a second connector port configured to connect to a vehicle battery via a second cable, and a power supply connector port electrically connected with the second connector port and configured to receive power via a power supply cable from a separate and external power supply.

A vehicle charging system includes a battery controller configured to electronically connect to an off-board service tool and programmed to, in response to verifying that a set of charge start conditions have been met following a charge start request, transmit a clear warnings request to the service tool and initiate power transfer from an off-board power supply to a vehicle battery, and in response to detecting a charge issue condition, cease the power transfer.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Disclosed herein is an off-board charging system that uses an off-shelf common power supply with a charging connector that interfaces with the high-voltage battery of a vehicle and a vehicle controller. The connector may include a first connector port which may include a microswitch to open or close the high-voltage interlock loop (HVIL). For example, the microswitch may open the HVIL in response to the high-voltage cable becoming disconnected during charging of the battery. The connector may also include a second connector port to connect a high-voltage cable to the high-voltage battery.

A battery controller within the vehicle may interact with a service tool administrated by a technician to run a charging routine. The charging routine may facilitate charging of the battery. Certain conditions or faults may prevent the charging routine from initiating or continuing. The charging routine disables certain diagnostic trouble codes (DTCs), such as low cell voltage or low state of charge (SOC), to allow the technician to charge the high-voltage battery.

Figure 1:
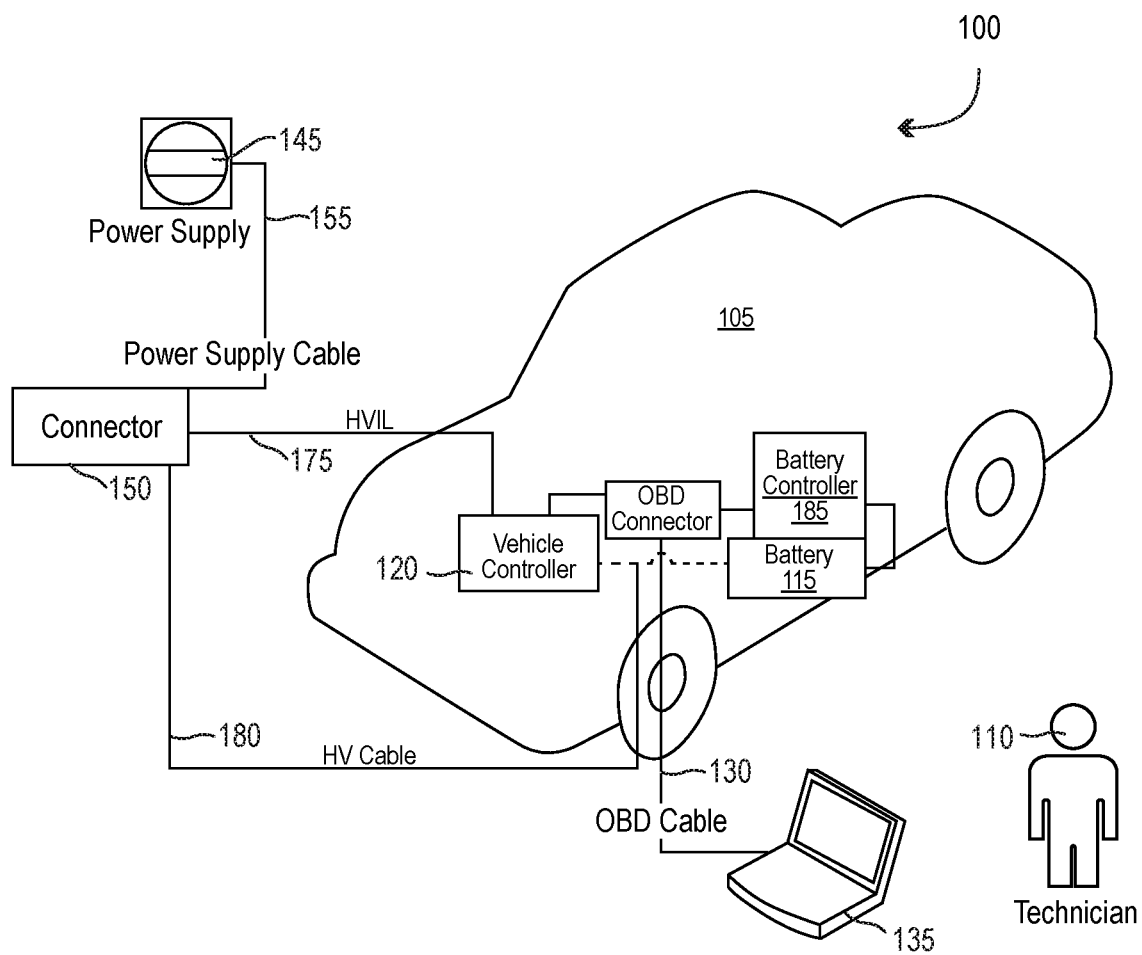
FIG. 1 illustrates a high-voltage charging system.
Figure 2:
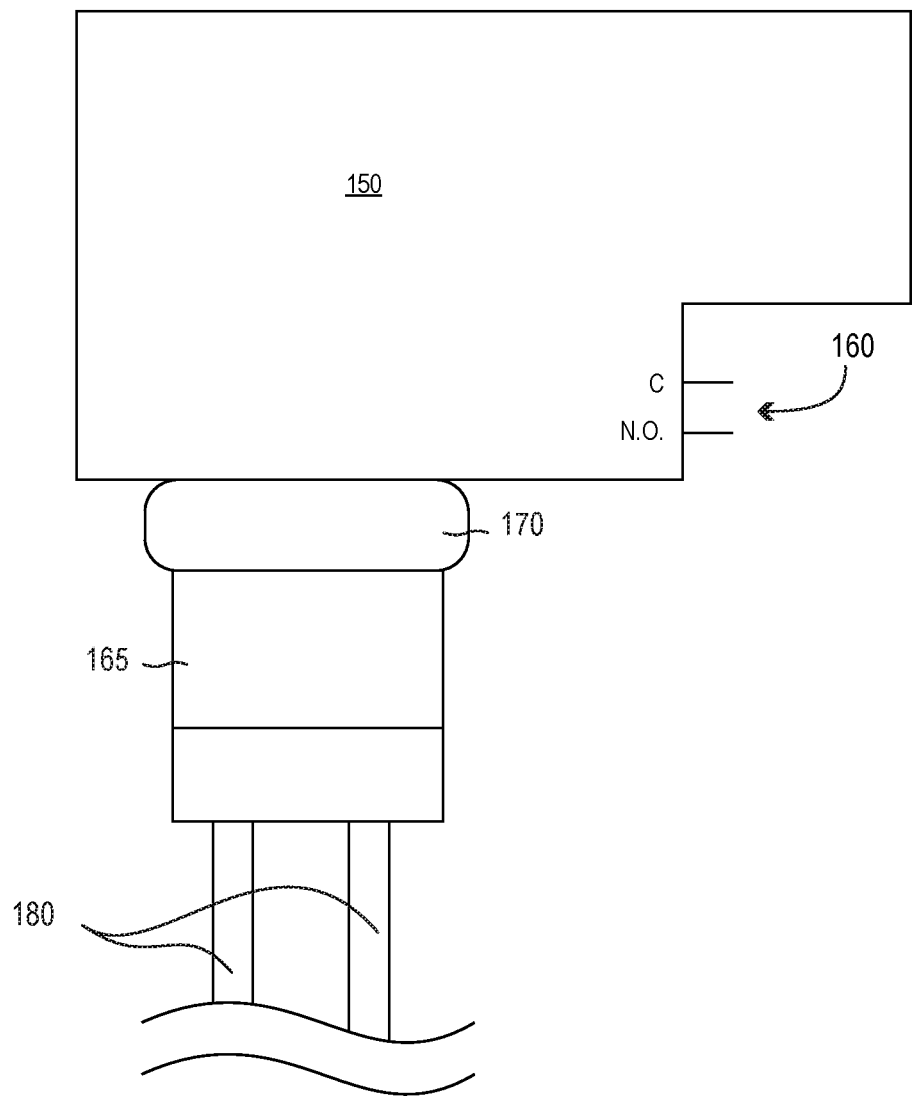
FIG. 2 illustrates a connector for the high-voltage charging system.

FIG. 1 illustrates a high-voltage charging system 100 for a hybrid vehicle 105 and FIG. 2 illustrates a connector 150 included in the system 100. Referring to both FIGS. 1 and 2, the system 100 may include a high-voltage battery 115. The high-voltage battery 115 may include a battery pack and may store energy to be used by the electric motors of the vehicle 105. The battery 115 may provide a high-voltage DC output. The battery 115 may include contactors (not shown and also referred to as main contactors herein). The main contactors are controlled by a battery controller 185, to connect or disconnect the high-voltage DC output. The battery 115 may be electrically connected to the electric motors and may provide the ability to bi-directionally transfer energy between the battery 115 and the motors. For example, a typical battery 115 may provide a DC voltage while the electric motors may require a three-phase AC current to function. In addition to providing energy for propulsion, the battery 115 may provide energy for other vehicle electrical systems.

The battery controller 185 may include a processor and a memory and may control and monitor the performance of the battery 115. The controller 185 may also control high-voltage bus connection by opening or closing the main contactors inside the battery 115. The battery controller 185 may also transmit battery data to a service tool 135 via an on board diagnostics (OBD) cable 130 and receive the HVIL status information from the vehicle controller 120 via controller area network (CAN) communication. In some examples, the battery controller may be a battery energy control module (BECM) 185, as referred to herein.

A vehicle controller 120 may include a processor and a memory, and may connect to the connector 150 to detect HVIL open fault within the charging system 100. The HVIL open fault detection may include checking the circuit voltage of the HVIL, and will be described in more detail in FIG. 3. In some examples, the vehicle controller may be an inverter controller, DC/DC converter, etc.

The battery controller 185 and the vehicle controller 120 may connect to an on board diagnostics connector 125. The OBD connector 125 may be a pin connector configured to receive the OBD cable 130 (also shown in FIG. 3 and also referred to a third cable). The OBD cable 130 may connect the battery controller 185 to a service tool 135. The service tool 135 may be a computer or other controller device operated by a technician 110. The service tool 135 may present the technician 110 with various on board diagnostic data received from the battery controller 185 over the OBD cable 130. Such data may include a state of charge of the battery 115, as well as other diagnostics about the charging systems. Data and instructions may be displayed via a tool display 140. This may be the screen of a computer, tablet, or other device. The tool display 140 may also be an audio output such as a speaker. While the tool display 140 is shown to be integral with the service tool 135, a separate tool display 140 may be possible. For example, the service tool 135 may transmit data and instructions to a technician's tablet or phone. A separate monitor may also be configured to present information to the technician 110.

While the service tool 135 is described herein as being managed by a technician 110, the charging system and the charging routine may be operated by high-voltage trained personnel other than the technician 110 such as dealers, repair personnel, etc.

The battery 115 may be recharged by an external power source such as power supply 145. The power supply 145 may connect to the connector 150 via a power supply cable 155. The power supply cable 155 may be any cable capable of transmitting power from the power supply 145 to the connector 150.

The connector 150 may be a device configured to receive power via the power supply cable 155. The connector 150 in turn may connect to the battery 115 via a high-voltage cable 180 (also referred to as a second cable). The connector 150 may include a microswitch 160 (shown in FIGS. 2 and 3 and also referred to as first connector port) to close or open a HVIL connector 190 at the vehicle controller 120, described in more detail below with respect to FIG. 3. The microswitch 160 may include a button 170 and terminal C and terminal NO (e.g., Normally Open), as shown in FIG. 2. In one example, the microswitch may be a Honeywell™ 785-V3-101. When the button 170 is pressed, terminal C and NO are closed inside the microswitch which in turn closes HVIL connection 190. When the button 170 is released, terminal C and NO are opened inside the microswitch which in turn opens the HVIL connection 190. The microswitch terminal C and NO may receive a HVIL cable 175 (also referred to as a first cable).

Figure 3:
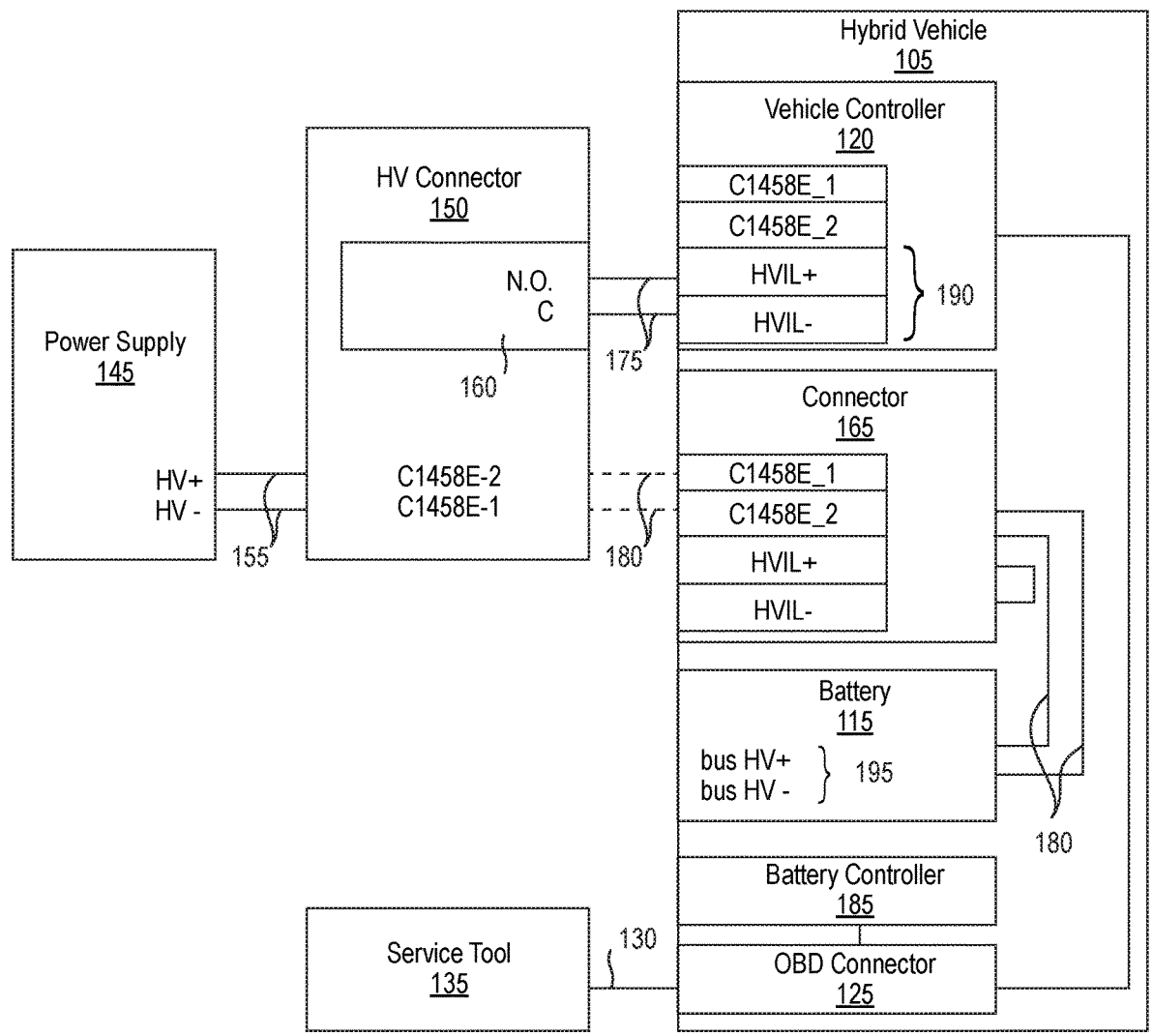
FIG. 3 illustrates a block diagram of a portion of the charging system.

FIG. 3 is a block diagram showing the connections between the power supply 145, the connector 150, the vehicle 105, and the service tool 135. As explained above with respect to FIG. 1, the power supply 145 may connect to the connector 150 via the power supply cable 155. The connector 150 may connect to the HVIL connection 190 of the vehicle controller 120 via the HVIL cable 175. The connector 150 may also connect to the battery 115 via the high-voltage connector 165 and the high-voltage cable 180. The OBD cable 130 may connect the service tool 135 and the OBD connector 125 of the vehicle 105. The battery controller 185 and the vehicle controller 120 are connected to the OBD connector 125.

During normal operation of the vehicle 105, that is, when the vehicle 105 is not connected to the service tool 135, the high-voltage cable 180 may connect the battery 115 and the vehicle controller 120 by the high-voltage connector 165 to the vehicle connector 120. During servicing and charging, when the service tool 135 is connected to the vehicle 105, the connector 165 may be disconnected from the vehicle controller 120 and the high-voltage connection (C1458E_1, C1458E_2) of connector 165 is connected to the high-voltage connection (C1458E-1 and C1458E-2) of the connector 150, as shown in the dashed line in FIG. 3. Further, during servicing, the HVIL 190 is open. Upon exposure, the HVIL 190 may be connected to the microswitch 160 via the HVIL cable 175.

The HVIL connection 190 may be used to protect the technician 110 from electric shock if the high-voltage connector 165 would become disconnected during charging. When high-voltage cable 180 is not fully seated, the button 170 may not be fully depressed and in turn the microswitch NO terminal is disconnected from the C terminal inside the microswitch, thus opening the HVIL 190. The vehicle controller 120 detects the voltage difference between the terminal pairs (e.g., HVIL+ and HVIL−), and transmits the HVIL open fault information to the battery controller 185. The battery controller 185 may quickly stop any current from transmitting via the high-voltage cable 180 by opening main contactors inside the battery 115. Adding the microswitch 160 may prevent, during battery charging, any current transfer until the high-voltage cable 180 is completely seated.

Figure 4:
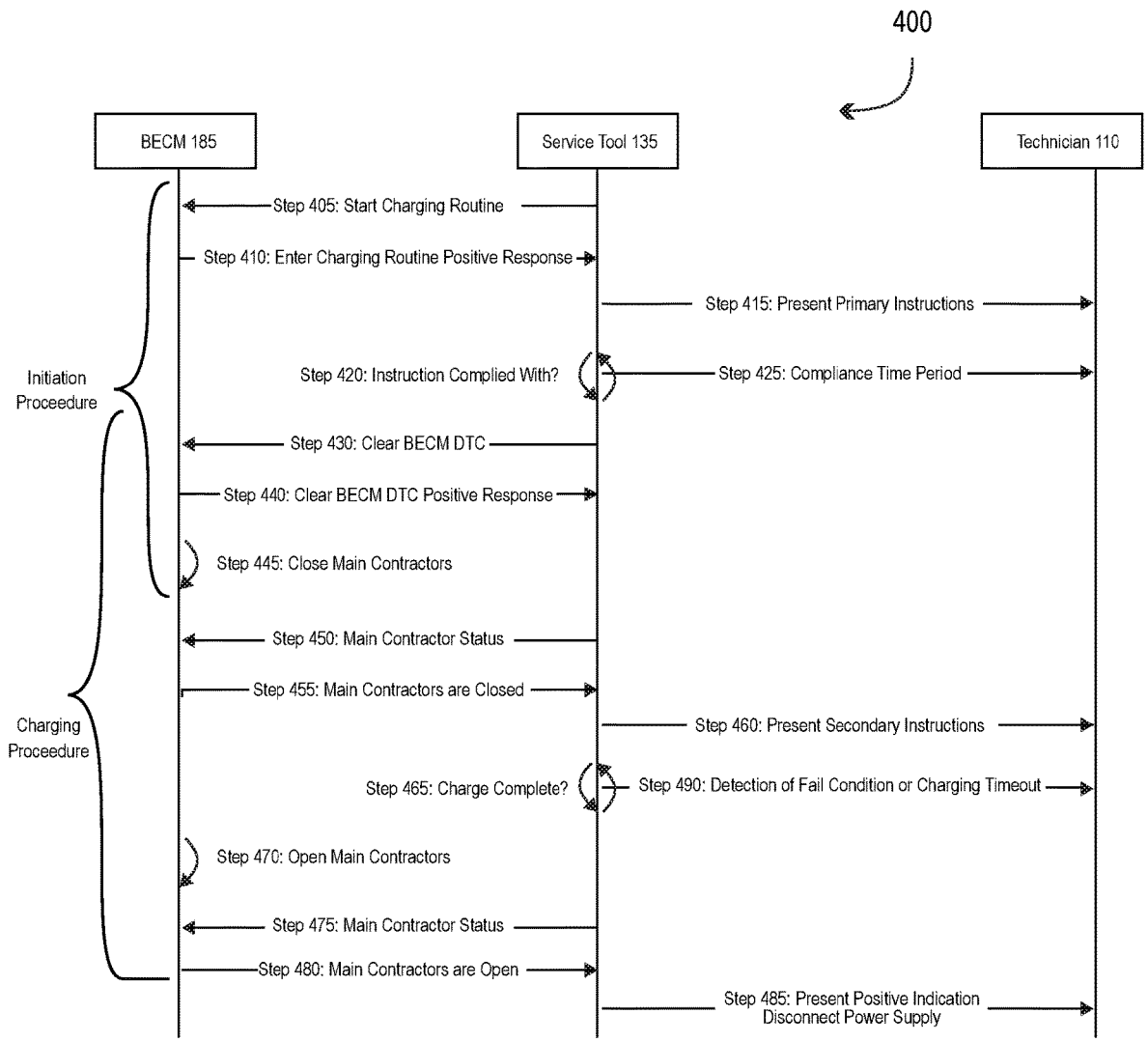
FIG. 4 illustrates a sequence flow chart for a charging process of the charging system.

FIG. 4 illustrates a sequence flow chart for a charging process 400 of the charging system 100 including the BECM 185, service tool 135 and technician 110.

At 405, the service tool 135 sends BECM 185 a primary, or start, request to enter charging routine. The BECM 185 may verify that certain start conditions are met. These start conditions may include but are not limited to (1) battery pack voltage (the pack voltage measured before the main contactors on the battery side) is within the pre-define safe charging range, such as greater than the minimum allowed pack voltage and less than the maximum allowed pack voltage, (2) BECM 185 does not lose communication with the vehicle controller 120, (3) battery pack voltage is less than the charge complete voltage, for example the pack voltage at 50% SOC, (4) vehicle gear is in park position, and (5) BECM 185 does not have the faults that prevent closing the main contactors within the battery 115, except low battery SOC fault or low pack or cell voltage fault. If these start conditions are verified by the BECM 185, the BECM 185 may transmit a positive response to the service tool 135 at 410. The service tool 135, at 415, may present primary, or start, instructions to the technician 110. As explained above, the instructions may be presented either audibly or visually via the tool display 140. The start instructions may include a list of actions for the technician 110 to take. These instructions may include but are not limited to (1) connect the power supply 145 to the vehicle 105, (2) support the 12 v battery with a 12 v battery charger, (3) turn off all accessory loads, (4) set power supply 145 voltage to the battery 115 pack voltage plus 5 v, (5) set power supply 145 current to 5 A, etc.

The service tool 135 and/or the BECM 185 may then verify at 420, that the technician 110 has complied with the primary instructions. That is, the service tool 135 may verify that at least a portion of the instructions. For example, the service tool 135 may verify that the technician 110 has set the power supply voltage to the battery voltage plus 5 v based on the pack voltage and bus voltage (the battery 115 pack voltage measured after the main contactors on the vehicle side) information received from BECM 185. At 425, if the instructions are not found to be in compliance within a predefined compliance time period, for example, approximately 10 minutes, the BECM 185 will exit the charging routine and instruct the service tool 135 to present a charge issue indication, and stop the charging process 400. This issue indication may include a "Charge Issue" output on the tool display 140.

At 430, the service tool 135 may send a diagnostic message to BECM 185 to request it to clear DTCs. The BECM 185 may first verify that certain DTCs are disabled, such as cell or pack voltage or battery state of charge over-discharge DTCs. These DTC codes may cause BECM to open high-voltage cable by opening the main contactors inside the battery 115. In order to charge the high-voltage battery 115, these codes should be disabled, so as to not interfere with the servicing process. Then the BECM 185 may clear the DTCs that were set, such as, for example, low SOC DTC, and return to the service tool 135 with a positive response at 440.

The BECM 185 also closes the main contactors inside the battery 115 at 445 to connect the battery 115 output to the power supply 145 output. At 450, the service tool 135 requests a contactor status from the BECM 185. The BECM 185 may return the contactor status at 455. The contactor status may include an indication that the contactors are closed. If the contactors are closed, the service tool 135 then presents secondary instructions to the technician 110 at 460. These instructions may include, but are not limited to (1) set the power supply 145 voltage to the predefine charge complete battery pack voltage, such as the pack voltage at 50% battery state of charge (SOC), and (2) set power supply current limit to 5 A.

The battery 115 is charged by the power supply 145 until the pack voltage reaches the power supply 145 output voltage. When the pack voltage reaches the predefined charge complete pack voltage, such as the pack voltage at 50% SOC, the BECM 185 may open the main contactors at 470.

At 475, the service tool 135 again requests a contactor status from the BECM 185. The BECM 185 may return the contactor status at 480. The contactor status may include an indication that the contactors are open. If the contactors are open, the service tool 135 then presents a positive indication, such as "charge pass" to the technician 110 at 485. The positive indication may be accompanied by instructions to disconnect the power supply 145.

If the BECM 185 detects the predefined time period is exceed at 425 and/or 490, or if the BECM 185 detects certain issue conditions at 490, the BECM 185 may exit the charging routine and transmit a negative message to the service tool 135. The service tool 135 may then display a charging issue indication to the technician 110. Issue conditions may include, but are not limited to (1) BECM sever faults are detected, such as HVIL open fault, (2) battery pack current exceeds charging current limit, for example, exceeds 6 A for 1 minute or 10 A for 5 seconds, (3) battery pack current exceeds discharge current, such as exceeds 0.5 A for 5 minutes, (4) battery pack voltage or bus voltage is out of predefined range, (5) battery pack voltage is greater than bus voltage by a certain threshold, (6) the vehicle is not in park position, (7) maximum charging time is exceeded, for example, 40 minutes, and (8) a stop routine request is received, etc. In one example, if even one of the fault conditions is present, the service routine may be aborted.

Figure 5:
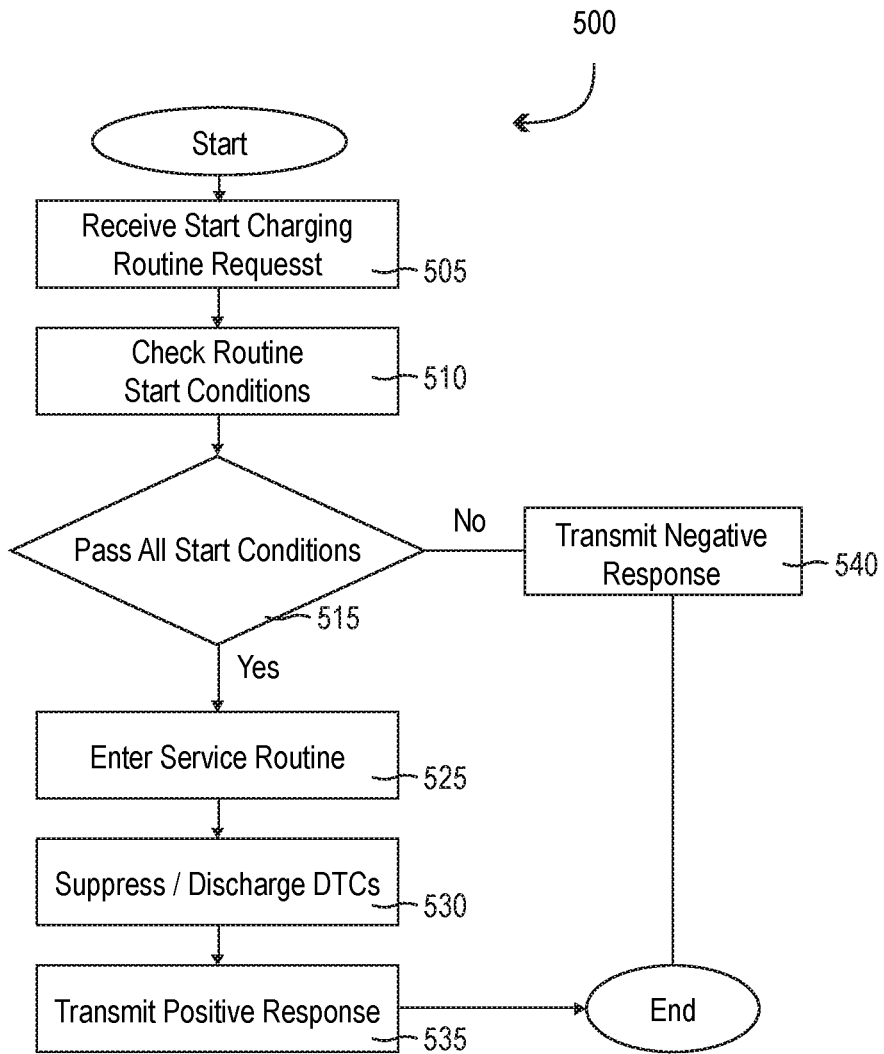
FIG. 5 illustrates a flow chart for an initiation procedure of the charging routine.

FIG. 5 illustrates a process 500 for an initiation procedure of the service routine implemented by the BECM 185. At block 505, the BECM 185 may receive the start request from the service tool 135. This request may be initiated by the technician 110 transmitting a start charging service routine request message at the service tool 135 (e.g., pressing a button and/or selecting an option via the tool display 140.), similar to step 405 of FIG. 4.

At block 510, the BECM 185 may check certain start conditions. That is, the BECM 185 may sense, receive and analyze various data representative of the start conditions. The various start conditions are described in step 405 above.

At block 515, the BECM 185 may determine whether all of the start conditions are met. If all start conditions are met, the process 500 proceeds to block 525. If not, the process 500 proceeds to block 540.

At block 525, the BECM 185 may enter the service routine. Upon entering the service routine, the BECM 185 may perform a number of service routine initiations. For example, the BECM 185 may clear various timers such as a charging timer (for maintaining a charging time), and a routine idle timer (for maintaining how long the routine has idled). The initiations may also include clearing a DTC flag to indicate to the BECM 185 that certain DTCs, such as low SOC DTC, have not been disabled and the DTC history has not been cleared. These initiations may function as housekeeping procedures within the BECM. If the BECM 185 does not reset various timers, an issue condition may be recognized (e.g., routine time out), and the main contactors may open.

At block 530, the BECM 185 may suppress or disable the DTCs caused by battery over-discharge, such as low cell voltage DTC or low SOC DTC. At block 535, the BECM 185 may transmit the charging routine entry positive response to the service tool 135, similar to step 410 in FIG. 4.

At block 540, if the charging routine entry conditions are not met, the BECM 185 may transmit a negative response to the service tool 135. The process 500 may then end and the service tool 135 may display the charging issue indication on the tool display 140.

Figure 6:
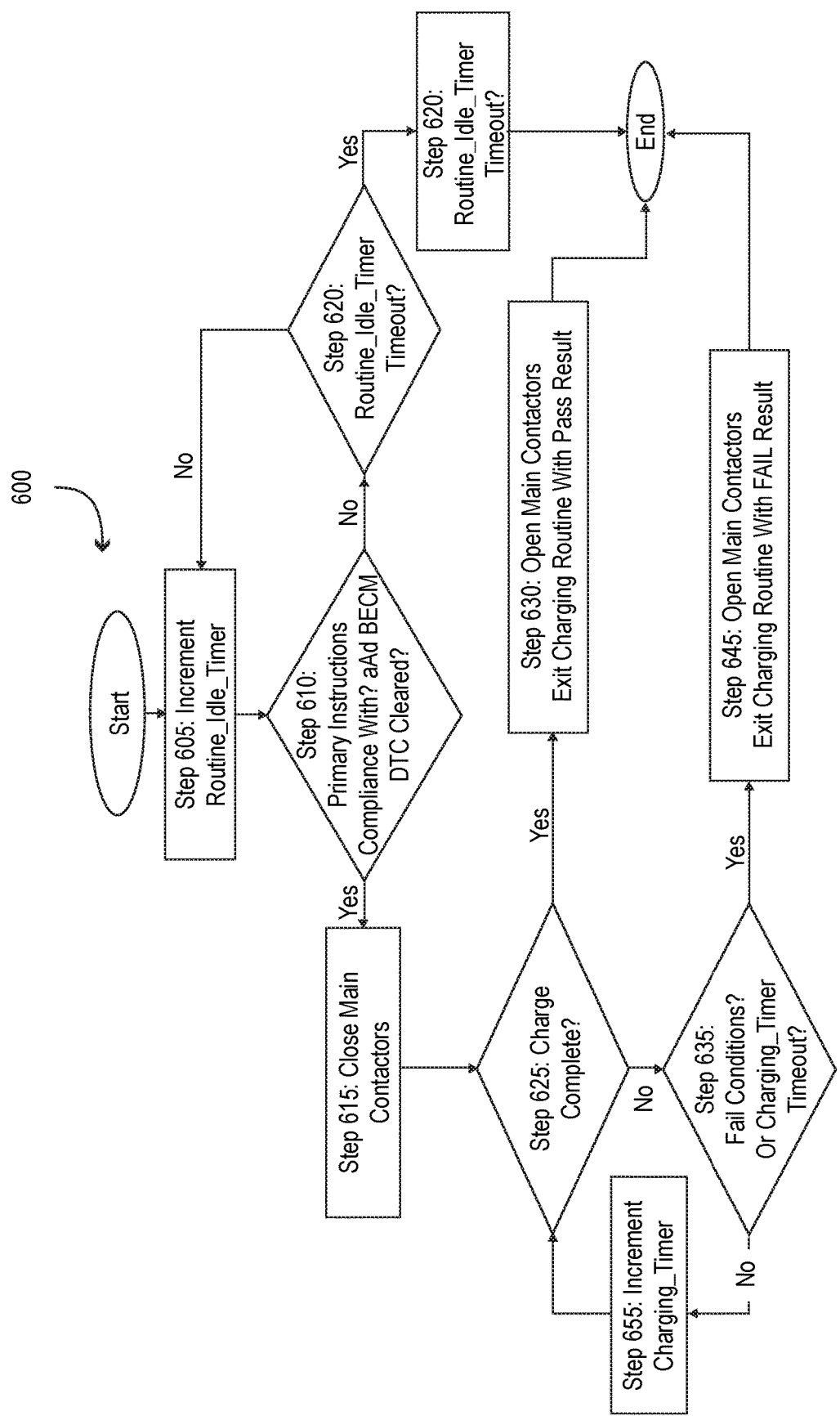
FIG. 6 illustrates a flow chart for a charging proceeding of the charging routine.

FIG. 6 illustrates a process 600 for a charging procedure of the service routine.

At block 605, the BECM 185 may increment the routine idle timer. At block 610, the BECM 185 may determine if the technician 110 has compliance with the primary instructions, similar to step 420 and 425 in FIG. 4. For example, the BECM 185 may determine if (1) the bus voltage reaches the battery pack voltage, and (2) that the BECM DTC is cleared, and (3) that the routine idle timer is not timeout. If all of these conditions are met, the process 600 may proceed to block 615. If not, the process 600 may proceed to block 620.

At block 615, the BECM 185 may close the main contactors, similar to step 445 in FIG. 4. At block 625, the BECM 185 may verify if the charging is complete, such as checking if the battery pack voltage reaches the voltage at the 50% battery SOC. If so, the process 600 proceeds to block 630. If not, the process 600 proceeds to block 635.

At block 630, the BECM 185 may open the main contactors, exit the charging routine and transmit a positive response to the service tool 135, similar to step 465, 470, 475, 480, and 485 of FIG. 4. The process 600 may then end.

At block 635, the BECM 185 may determine whether an issue condition has been detected or the charging timer has timed out. Such issue conditions are explained above with respect to step 490. If an issue condition is recognized or charging timer is timeout, the process 600 proceeds to block 645. If no issue condition is recognized, the process 600 proceeds to block 655.

At block 645, upon detection of an issue condition or charging timer timeout, the BECM 185 may open the main contactors, exit the charging routine and transmit a negative response to the service tool 135, similar to step 490, 470, 475, 480, and 485 of FIG. 4. To exit the charging routine, the BECM 185 opens the main contactors at block 640. The process 600 may then end.

At block 655, the BECM 185 increments the charging timer. The process 600 continues in the charging routine until charging is complete, or an issue condition is detected, or the charging timer is timed out.

Accordingly, a high-voltage battery charging system is described herein. The system includes a universal power supply, a high-voltage connector and a BECM charging routine. The connector facilitates universal charging while including a built-in safety mechanism. The charging routine allows for an automatic charging system that prevents against human error, improper charge levels, etc. The system may be implemented worldwide across different vehicle lines, makes and models. The system provides a user-friendly interface, and convenient vehicle installation using simple and minimal hardware.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An off-board battery charger for a vehicle, comprising:
a high-voltage connector having a first connector port configured to connect to a vehicle controller via a first cable, a second connector port configured to connect to a vehicle battery via a second cable, and a power supply connector port electrically connected with the second connector port and configured to receive power via a power supply cable from a separate and external power supply,
wherein the first connector port includes a pair of contacts configured to close in response to an actuation at the second connector port to permit current to pass from the external power supply to the vehicle controller via the first cable,
wherein the second connector port includes an actuatable button configured to indicate whether the second cable is seated.

2. The charger of claim 1, wherein the first cable is configured to connect to a high-voltage interlock connection at the vehicle controller.

3. An off-board battery charger for a vehicle, comprising:
a high-voltage connector having a first connector port configured to connect to a vehicle controller via a first cable, a second connector port configured to connect to a vehicle battery via a second cable, and a power supply connector port electrically connected with the second connector port and configured to receive power via a power supply cable from a separate and external power supply,
wherein the first connector port includes a pair of contacts configured to close in response to an actuation at the second connector port to permit current to pass from the external power supply to the vehicle controller via the first cable, wherein the second connector port includes an actuatable button configured to indicate whether the second cable is seated.

4. The charger of claim 3, wherein the first cable is configured to connect to a high-voltage interlock connection at the vehicle controller.

5. An off-board battery charger for a vehicle, comprising:
a high-voltage connector having a first connector port configured to connect to a vehicle controller via a first cable, a second connector port configured to connect to a vehicle battery via a second cable, and a power supply connector port electrically connected with the second connector port and configured to receive power via a power supply cable from a separate and external power supply,
wherein the first connector port includes a pair of contacts configured to close in response to an actuation at the second connector port to permit current to pass from the external power supply to the vehicle controller via the first cable, and wherein the second connector port includes an actuatable button configured to indicate whether the second cable is seated.

6. The charger of claim 5, wherein the first cable is configured to connect to a high-voltage interlock connection at the vehicle controller.

\* \* \* \* \*